United States Patent [19]

Jennison

[11] Patent Number: 5,658,469
[45] Date of Patent: Aug. 19, 1997

[54] METHOD FOR FORMING RE-ENTRANT PHOTORESIST LIFT-OFF PROFILE FOR THIN FILM DEVICE PROCESSING AND A THIN FILM DEVICE MADE THEREBY

[75] Inventor: Michael J. Jennison, Broomfield, Colo.

[73] Assignee: Quantum Peripherals Colorado, Inc., Louisville, Colo.

[21] Appl. No.: 570,487

[22] Filed: Dec. 11, 1995

[51] Int. Cl.$^6$ ........................................ B44C 1/22
[52] U.S. Cl. .................. 216/22; 216/40; 216/41
[58] Field of Search ................... 156/649.1, 654.1, 156/655.1, 659.11; 216/22, 41, 44, 49, 40; 430/313, 296, 5

[56] References Cited

U.S. PATENT DOCUMENTS 5,467,881   11/1995   Gill ........................................ 216/22

OTHER PUBLICATIONS

Livesay, W.R.; Vertical Lithography–Controlling Resist Profiles in Optical Lithography with a Large Area Electron Beam; Copyright 1994 Electron Vision Corporation.

*Primary Examiner*—William Powell
*Attorney, Agent, or Firm*—William J. Kubida; Holland & Hart LLP

[57] ABSTRACT

A method for forming a re-entrant photoresist lift-off profile for thin film device processing of particular utility in conjunction with self-aligned sputtered films, such as permanent magnet ("PM") films, for use in magnetoresistive ("MR") read heads as well as a device made thereby. Photoresist is patterned in a conventional manner upon the thin film layers overlying a suitable substrate and the photoresist is then exposed to a suitable developer resulting in photoresist regions having substantially vertical sidewalls. An electron beam, or other suitable energy source, is then utilized to cross-link (or render relatively insoluble) the upper portion of the positive tone resist image by accelerating a sufficient dose of electrons into the photoresist to a well controlled depth. A second electron beam is then distributed throughout the entire photoresist thickness to render the lower portion of it relatively more soluble in a developer. The resist is then developed for a predetermined time to achieve an undercut in the lower portion of the photoresist.

16 Claims, 4 Drawing Sheets

METHOD FOR FORMING RE-ENTRANT PHOTORESIST LIFT-OFF PROFILE FOR THIN FILM DEVICE PROCESSING AND A THIN FILM DEVICE MADE THEREBY

CROSS REFERENCE TO RELATED APPLICATIONS

The present invention is related to the subject matter of U.S. Pat. No. 5,485,334 issued Feb. 16, 1996 (application Ser. No. 08/392,393 filed Feb. 22, 1995) for "Magnetoresistive Device and Method Having Improved Barkhausen Noise Suppression" and United States patent applications Ser. No. 08/461,874 filed Jun. 5, 1995 for "Soft Adjacent Layer Biased Magnetoresistive Device Incorporating a Natural Flux Closure Design Utilizing Coplanar Permanent Magnet Thin Film Stabilization" and 08/401,553 filed Mar. 9, 1995 for "Shaped Spin Valve Type Magnetoresistive Transducer and Method for Fabricating the Same Incorporating Domain Stabilization Technique". The foregoing patent and patent applications are assigned to Quantum Peripherals Colorado, Inc., Louisville, Colo., the disclosures of which are hereby specifically incorporated by this reference.

BACKGROUND OF THE INVENTION

The present invention relates, in general, to the field of thin film devices and processing. More particularly, the present invention relates to a method for forming a re-entrant photoresist lift-off profile for thin film device processing of particular utility in conjunction with self-aligned sputtered films, such as permanent magnet ("PM") films, for use in magnetoresistive ("MR") read heads.

In the processing of thin film devices, such as magnetoresistive heads, a "lift-off" process may be used to selectively remove thin, sputtered films from patterned areas on the layers overlying the device substrate. In this regard, re-entrant (or undercut) photoresist sidewalls are used to define the patterned area. Utilizing re-entrant sidewalls, the upper portion of the photoresist feature is wider than its base in order to facilitate subsequent removal of the photoresist by a suitable solvent.

One common approach to achieving a re-entrant photoresist sidewall as been through the use of an image reversal photoresist process in which a positive tone photoresist is rendered negative by means of post exposure bake and flood expose steps. In this manner, an undercut may be generated which is suitable for some applications. Still further, double photoresist layers may be used to define the patterned areas wherein two separate overlying layers of photoresist may be patterned, with the lower layer being more soluble than the upper layer. Because of the differing etch rates, exposure to a standard chemical bath can generate a desired undercut also suitable for limited applications.

Thin film permanent magnet layers are often utilized with MR read heads, or sensors, to provide a longitudinal bias to the active MR region in order to provide Barkhausen noise suppression. Desirably, the permanent magnet layers are applied through the use of a self-aligned process in order to ensure their proper and uniform alignment with the MR element. This self-alignment is achieved by depositing a thin permanent magnet film (in conjunction with a non-magnetic metal or dielectric separation layer) onto a previously defined MR element that is protected by photoresist material. The MR element may comprise, for example, a multilayer magnetoresistive structure ("MRS") on a suitable substrate, wherein the MRS includes an MR layer overlying a magnetic spacing layer ("MSL") in conjunction with an underlying soft adjacent layer ("SAL") to provide transverse bias to the MR element. The active region of the MR element may be defined by use of photoresist appropriately patterned on the MRS to allow, for example, etching away portions of the MR layer and underlying MSL and SAL layers. Leaving the photoresist over the active MR region and then depositing the separation and PM layers places the permanent magnet layers in correct alignment with the MR active region. Subsequent removal of the photoresist by etching in a suitable solvent removes the PM material overlying the photoresist as well while leaving the desired PM material properly positioned adjacent the MR element. The foregoing United States patent discloses a process for effectuating the foregoing.

The re-entrant, or undercut, photoresist profile described above is, in this application, extremely useful to enable a suitable solvent to penetrate the photoresist material to etch it away. This is because if the overlying PM material conforms to the entire resist profile, the solvent will be precluded from reaching the photoresist and dissolving it. Moreover, it has heretofore been extremely difficult to consistently pattern undercut profiles in photoresist using standard image reversal and double photoresist layer processes, particularly with device features in the range of 1.5 μm or less. It is therefore highly desirable to provide an improved method for forming a re-entrant photoresist lift-off profile for thin film device processing which is of particular utility in conjunction with self-aligned sputtered films, such as permanent magnet films, for use in MR read heads.

SUMMARY OF THE INVENTION

The method of the present invention utilizes a differential electron beam exposure system as an adjunct to consistent generation of an undercut, or re-entrant, photoresist profile utilizing a positive tone resist feature. In this regard, standard photolithography techniques may be used to define the positive tone image such as through the use of spin coating to achieve a uniform, thin film (on the order of 2 μm) of photoresist. A positive tone image is then formed by projecting a mask pattern onto the photoresist covered wafer, exposing the photoresist material to a differing applications of a suitable energy source and then developing the wafer in a chemical bath.

Utilizing the process of the present invention, photoresist may be patterned in any manner, for example by spin coating, upon the thin film layers overlying a suitable substrate. Selected areas are exposed to an appropriate energy source, such as light, through a mask pattern and the photoresist layer is then exposed to a suitable developer resulting in photoresist regions having substantially vertical sidewalls. An electron beam, or other suitable energy source, is then utilized to cross-link (or render relatively insoluble) the upper portion of the positive tone resist image by accelerating a sufficient dose of electrons into the photoresist to a well controlled depth. A second electron beam is then distributed throughout the entire photoresist thickness to render the lower portion of it relatively more soluble in a developer. The resist is then developed for a predetermined time to achieve an undercut in the lower portion of the photoresist. The resultant re-entrant photoresist profile can then be utilized in conjunction with subsequent device processing steps such as thin film sputtering and ion milling to produce the desired device structure.

In accordance with a particular embodiment of the present invention, disclosed herein is a process for facilitating lift-off of photoresist patterned overlying a substrate in conjunction with photolithographic processing of the substrate and any overlying layers to define a surface feature. The process comprises the steps of: patterning the photoresist on a major surface of the substrate to define a patterned area; cross-linking a first portion of the photoresist distal to the substrate; solubilizing a second portion of the photoresist proximal to the substrate; and developing the photoresist to create an undercut in the photoresist peripherally surrounding the patterned area.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1A:
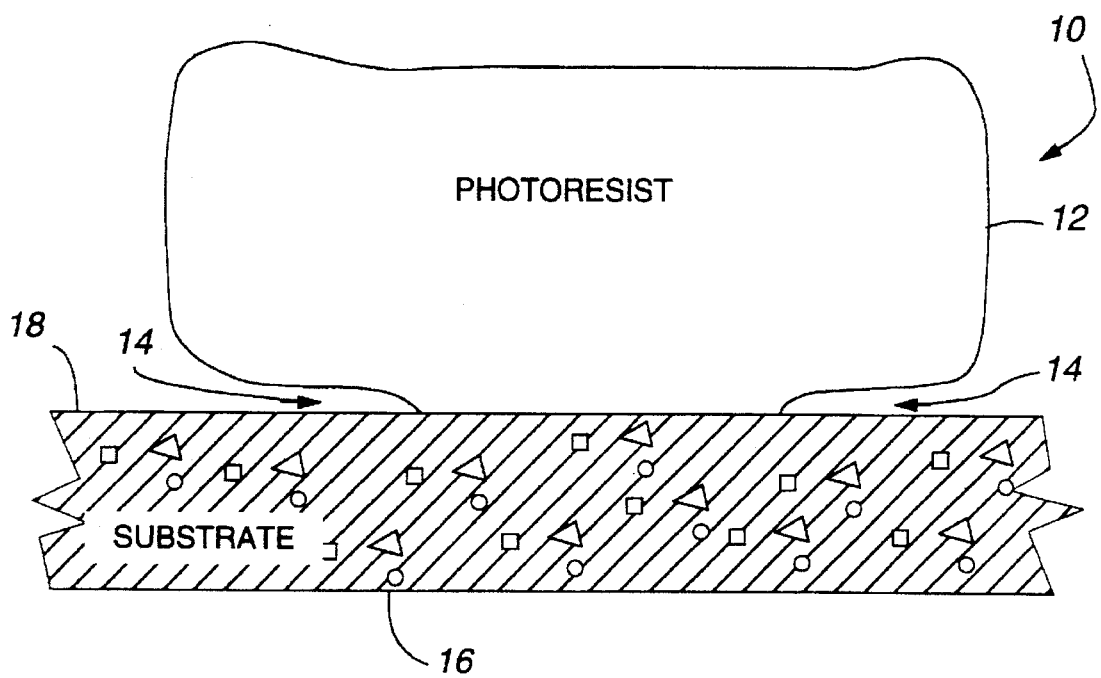
FIG. 1A illustrates a simplified cross-sectional side elevational view of a re-entrant photoresist profile which may be furnished utilizing a conventional image reversal process.

With reference now to FIG. 1A, a re-entrant photoresist region 10 is shown formed by means of a conventional image reversal process. The re-entrant photoresist region 10 comprises a patterned portion of photoresist 12 beneath which are formed undercuts 14 which, in conjunction with the interface of the photoresist region 10 to the major surface 18 of substrate 16, allow for the introduction and penetration of a suitable solvent to remove the photoresist 12 following its use in protecting a desired area of the substrate 16 major surface 18. In the approach to producing the re-entrant photoresist region 10 shown, an image reversal process is utilized wherein a positive tone photoresist 12 is rendered negative through a subsequent post exposure bake and flood exposure process. This results in the production of the undercuts 14 shown and is suitable for certain conventional thin film lift-off applications since any overlying thin film will not cover the undercuts and a suitable solvent may then be used to remove the photoresist 12. However, it is extremely difficult to reproducibly define the undercuts 14 through the use of an image reversal process and particularly so with relatively narrow device dimensions of on the order of 1.5 μm or less.

Figure 1B:
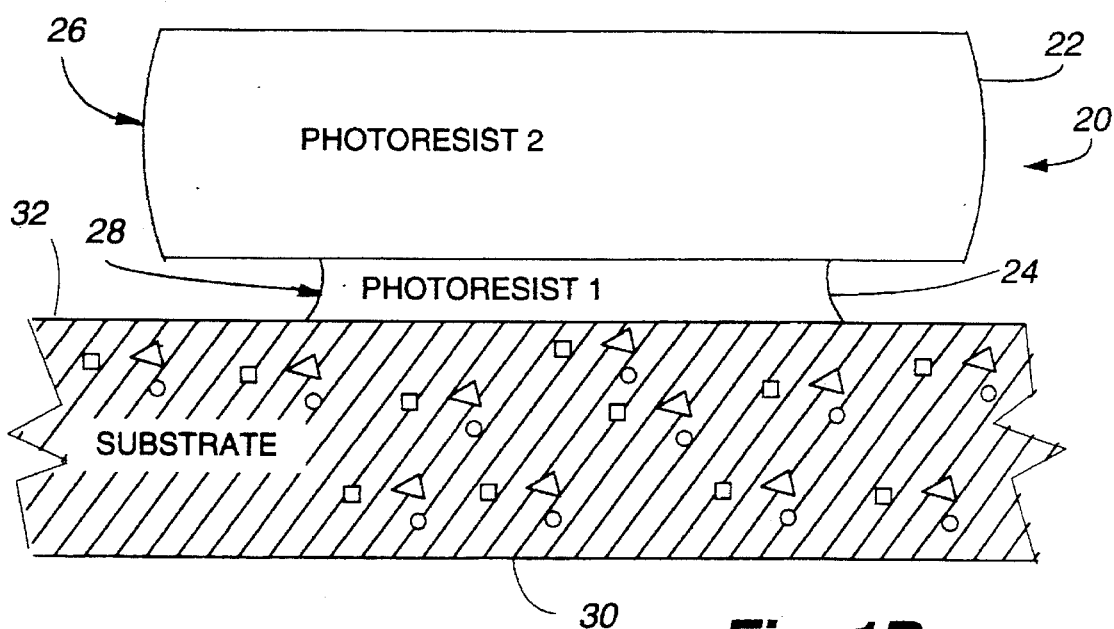
FIG. 1B illustrates a simplified cross-sectional side elevational view of a re-entrant photoresist profile which may be furnished utilizing dual photoresist layers having differing solubilities.

With additional reference now to FIG. 1B, another conventional approach to producing a re-entrant photoresist region 20 is shown. In this approach, the photoresist region 20 includes a first photoresist region 24 ("Photoresist 1") formed on a major surface 32 of a substrate 30 together with a second photoresist region 22 ("Photoresist 2") formed thereupon. Utilizing a relatively more soluble photoresist for the first photoresist region 24 than that utilized in the second photoresist region 22, a cap 26 is formed of the latter while a pedestal 28 is formed in the former due to the differential in their respective etch rates in a standard chemical bath. The resultant structure provides a functionally analogous re-entrant photoresist region 20 to that of the corresponding re-entrant photoresist region 10 of FIG. 1. Moreover, in addition to the more complex photolithographic operations and processing steps involved in producing it, it nonetheless presents many of the same problems with respect to the inability to accurately reproduce undercuts to facilitate subsequent photoresist lift-off, particularly following a thin film application step with devices of the same relatively small geometries.

Figure 2A:
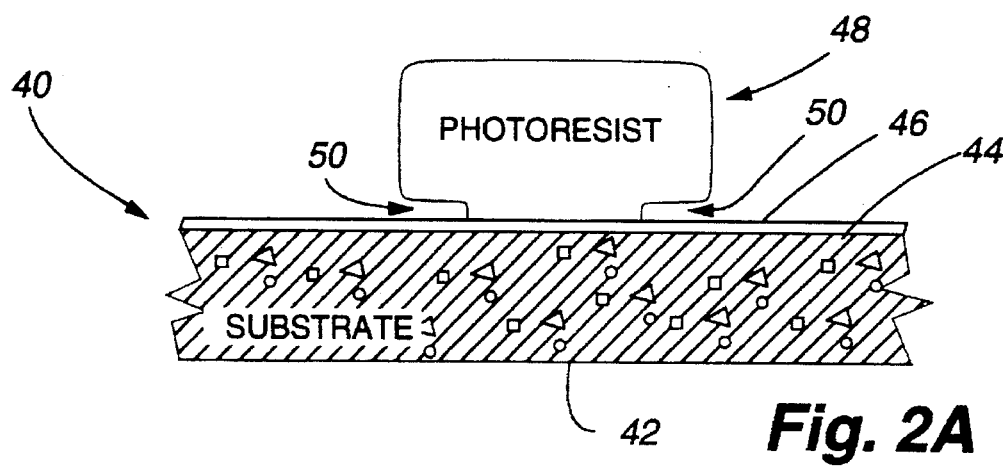
FIGS. 2A–2C illustrate a conventional self-aligned process flow for removing selected portions of one or more upper layers (for example, MSL and SAL layers) overlying a substrate to define an active MR region followed by a thin film PM sputtering process utilizing the same photoresist to provide alignment between the remaining PM layers and the MR region.
Figure 2B:
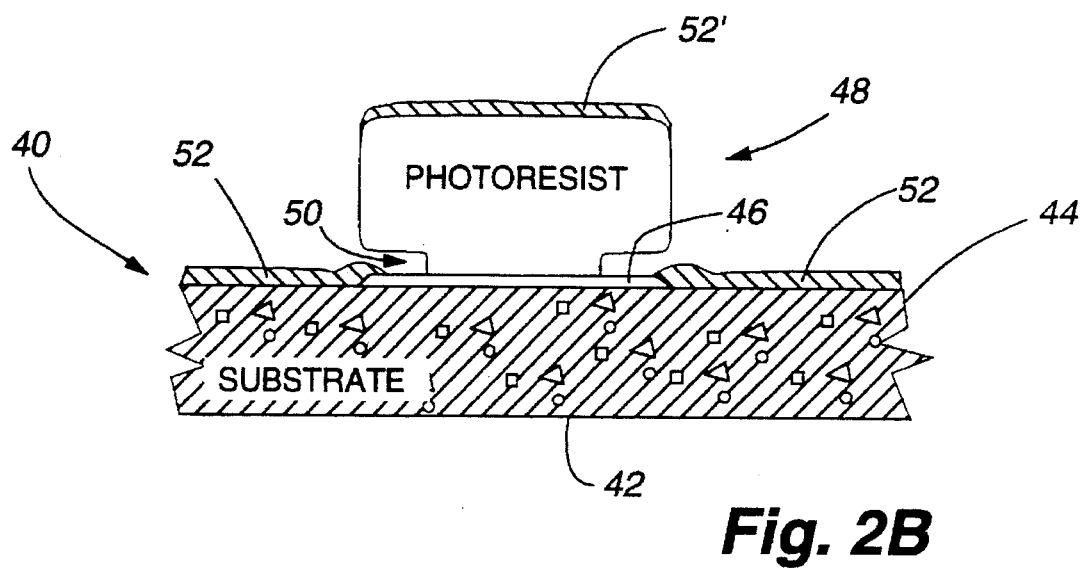
Figure 2C:
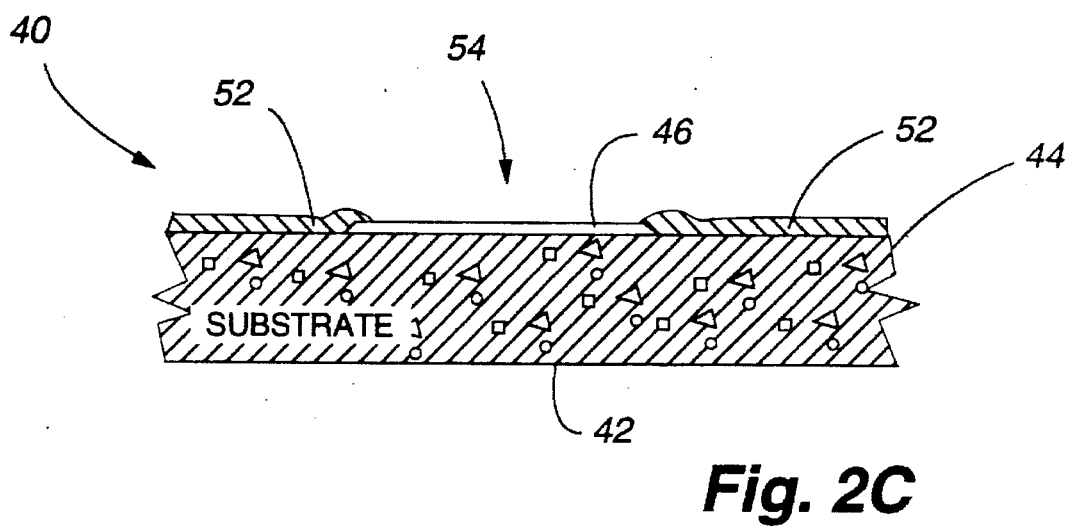

With additional reference now to FIGS. 2A–2C, a self-aligned thin film process flow 40 is shown for use, for example, in producing an MR head having longitudinal bias applied to an active region thereof by means of opposing PM layers.

The process flow 40 begins, as shown in FIG. 2A, with the provision of a substrate 42 having a major surface 44 thereof. One or more layers 46 may overlie the major surface 44 of the substrate 42. In the fabrication of an MR head in accordance with that structure and process disclosed in the aforementioned United States patent, the one or more layers 46 may comprise an MRS structure wherein the SAL layer represents approximately 200Å–500Å of NiFeMo, the MSL layer represents approximately 100A–250A of Ta and the MR layer represents approximately 200A–500A of NiFe.

A re-entrant photoresist region 48 may be formed in accordance with the present invention as hereinafter disclosed in more detail providing undercuts 50 adjoining the layers 46. As shown particularly with respect to FIG. 2B, in addition to defining the dimensions and geometry of an active region of an MR device by selective removal of portions of the layers 46, thin film layers 52 and 52' may be deposited on the major surface 44 of the substrate 42 and the upper surface of the re-entrant photoresist region 48 respectively as shown in FIG. 2B.

With reference particularly to FIG. 2C, utilizing the same photoresist region 48 used to define the active region of the MR device, the thin film layers 52 are inherently self-aligned with the device structure. The undesired thin film layer 52', since it does not cover or intrude into the undercuts 50, does not preclude the introduction of a suitable solvent to remove the re-entrant photoresist profile 48 through the undercuts 50 even if portions of the thin film covers the sides of the photoresist, and thin film layer 52' is removed as part of the photoresist removal process. The structure shown in FIG. 2C then provides an MR head having an active region 54 and self-aligned thin film layers 52 which may comprise corresponding thicknesses of PM material such as CoPt, CoPtCr or CoPtTa. Although not shown, a separation layer of a non-magnetic metal such as Cr or a dielectric material such as aluminum oxide may advantageously separate the active region 54 of the MR head from the longitudinal biasing elements comprising the thin film layers 52.

Figure 3A:
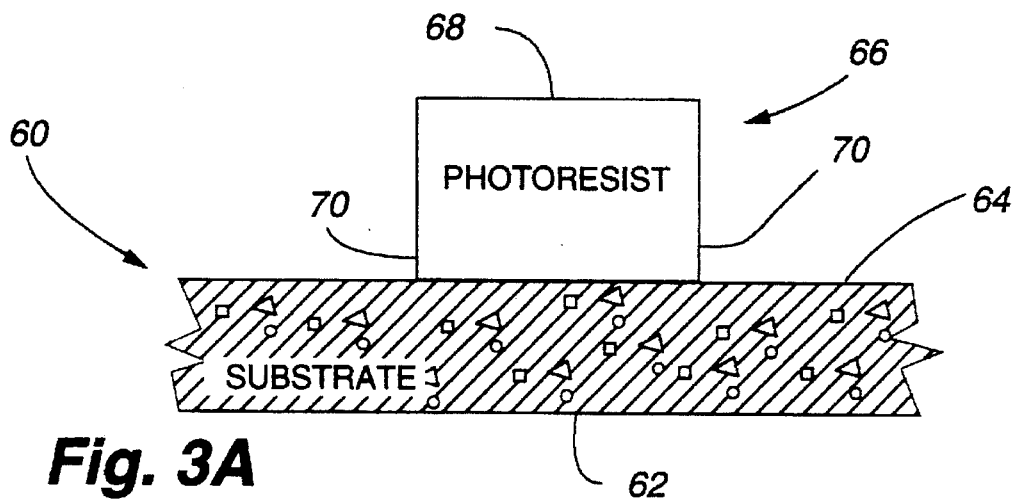
FIGS. 3A–3C illustrate a process flow for forming a re-entrant photoresist lift-off profile for thin film device processing of particular utility in conjunction with self-aligned sputtered films, such as permanent magnet films for use in forming an MR sensor in accordance with the preceding figures, wherein a first upper portion of the photoresist is cross-linked (or rendered relatively insoluble) by means of a first application of an electron beam accelerated to a predetermined depth followed by a second application of an electron beam distributed throughout the photoresist thickness to render a second lower portion thereof relatively more soluble followed by a chemical development process to create the desired re-entrant profile.
Figure 3B:
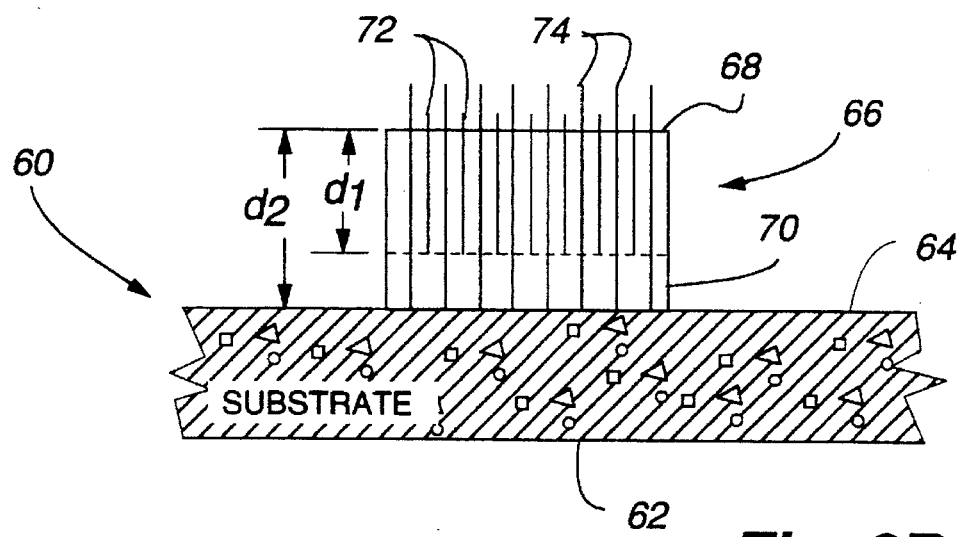
Figure 3C:
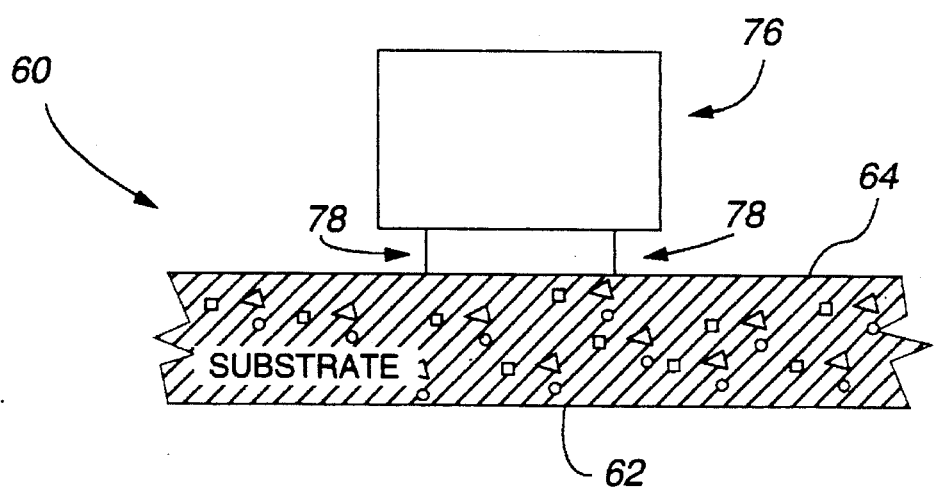

With additional reference now to FIGS. 3A–3C, a representative process flow 60 for producing a re-entrant (or undercut) photoresist profile in accordance with a method of the present invention is shown. The process flow 60 begins with the provision of a suitable substrate 62 presenting a major surface 64 thereof. A photoresist region 66 is then defined in a conventional manner on the major surface 64, such as through spin coating, to achieve a relatively thin (on the order of 2.0 µm) uniform photoresist film on which a positive tone image is then formed by projecting a mask pattern and exposing the photoresist film through the mask to harden desired areas. Undesired portions of the photoresist film are then removed to leave the photoresist region 66 shown. In a preferred embodiment, the photoresist region 66 may be formed of AZ Hoechst Celanese 4000 Series photoresist.

The photoresist region 66 presents an upper surface 68 displaced distally from the major surface 64 of the substrate 62 as well as substantially vertical side walls 70 extending therebetween. The substantially vertical sidewalls 70 of the photoresist region 66 may be conveniently formed utilizing a vertical lithography process developed by Electron Vision Corporation.

With particular reference now to FIG. 3B, and as previously described, the photoresist region 66 has been processed as a positive tone image wherein the areas exposed to light from the exposure system and mask are dissolved in a suitable developer giving the resulting image substantially vertical side walls 70. A first electron beam dose 72 is then directed toward the upper surface 68 of the photoresist region 66 and accelerated to a predetermined, well defined depth $d_1$ therefrom. The first electron beam dose 72 serves to cross-link, or render relatively insoluble, a first upper portion of the photoresist region between the upper surface 68 and a plane delimited by the depth $d_1$. In a preferred embodiment, the first electron beam dose 72 is conducted at a moderate level of on the order of 300 µC/cm$^2$ at 10 kV in a chamber evacuated to 25 mTorr.

A second electron beam dose 74 is then applied through the entire photoresist region 66 to a depth of $d_2$. This serves to solubilize a second portion of the photoresist region 66 between the plane at $d_1$ and the upper surface 64 of the substrate 62. In a preferred embodiment, the second electron beam dose 74 may be conducted at 50 µC/cm$^2$ at 17 kV in a chamber evacuated to 0.25 mTorr.

The photoresist region 66 is then developed for an appropriate time, as shown particularly in FIG. 3C, to produce a re-entrant photoresist profile 76 having undercuts 78. Utilizing the photoresist previously described, the development step may be undertaken utilizing AZ 400K developer for a period of substantially between 1–2 minutes. An $O_2$ ash step may further be performed at this point to remove residual organic materials from the structure within the processing system. The desired pattern may then be etched into the substrate (and/or MRS structure) by, for example, an ion milling operation.

It should be noted that the substrate 62 may include one or more layers as previously described with respect to FIGS. 2A–2C (an MRS structure) with the re-entrant photoresist profile 76 being utilized as therein described to ultimately produce an MR read head with self-aligned PM thin film elements (and/or corresponding separation layers) for providing a longitudinal bias to the active device region.

Figure 4:
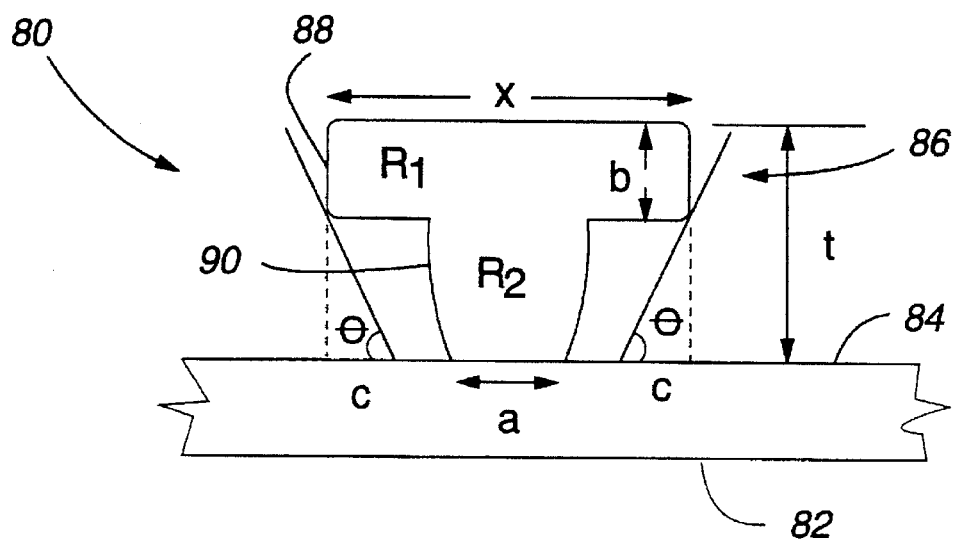
FIG. 4 illustrates the relative dimensions of a re-entrant photoresist profile which may be achieved utilizing the method of the present invention.

With reference additionally now to FIG. 4, a representative re-entrant photoresist profile 80 produced in accordance with a method of the present invention is shown. The photoresist profile 80 is formed once again upon a substrate 82 presenting a major surface 84 thereof. Photoresist 86 is patterned on the major surface 84 and, in accordance with the technique disclosed herein, a cap portion 88 is formed overlying a pedestal portion 90.

Given the following:

$R_2$=dissolution rate of pedestal portion 90

$R_1$=dissolution rate of cap portion 88 and x=width of the re-entrant photoresist profile 80 at the cap portion 88 a=pedestal portion 90 width t=photoresist 86 thickness b=ledge thickness of cap portion 88

θ=angle of ion milling operation $$MRS_{WIDTH}=(x-2c) \qquad \text{(Equation 1)}$$

as can be seen:

a≦(x–2c) and a≧x/3

Since:

tan θ=(t–b)/c c=(t–b)/tan θ

Substituting for c in Equation 1

$$MRS_{WIDTH}=x-2((t-b)/TAN\ \theta) \qquad \text{(Equation 2)}$$

As an example, if x=1.0 µm, t=0.8 µm, b=0.2 µm→0.6 µm and θ=75°:

TABLE 1

| b (µm) | → | 0.2 | 0.4 | 0.6 |
|---|---|---|---|---|
| $MRS_{WIDTH}$ |  | .68 | .78 | .89 |
| a |  | .33 | .33 | .33 |
| c |  | .16 | .11 | .05 |

Thus, with the accurate reproducibility of the re-entrant photoresist profile 80 shown, very narrow MR read head geometries may be produced.

Figure 5A:
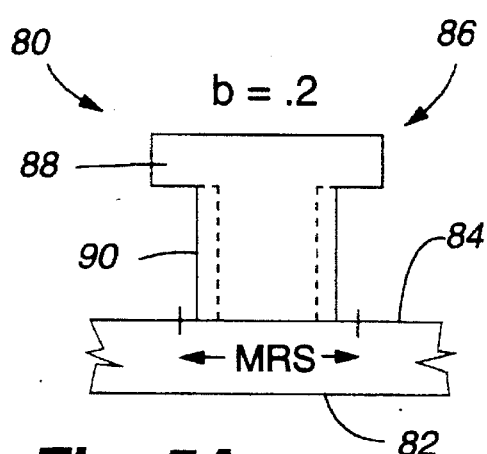
FIGS. 5A–5C illustrate various re-entrant photoresist profiles which might be utilized to define the active region of an MR sensor and provide aligned PM thin films for providing longitudinal bias thereto utilizing the method of the present invention.
Figure 5B:
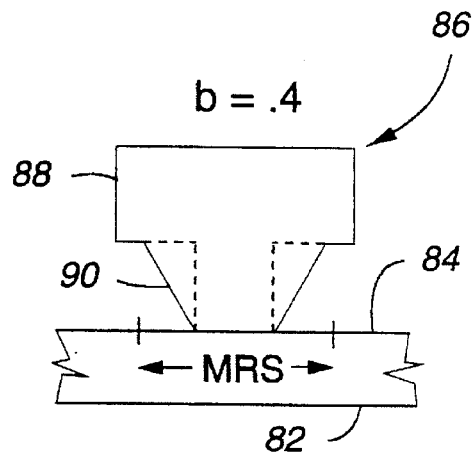
Figure 5C:
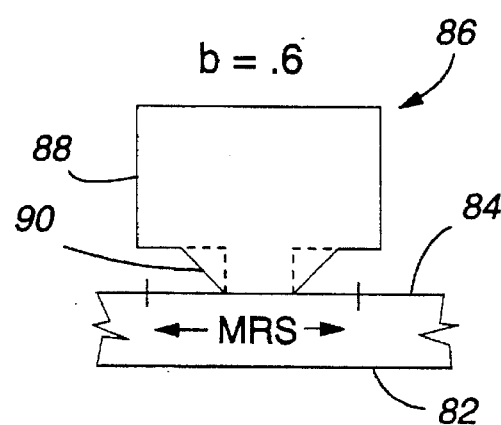

With reference additionally now to FIGS. 5A–5C, some representative re-entrant photoresist profiles 80 are shown produced in accordance with the foregoing equations (and corresponding to the entries in the preceding Table 1) to produce an active MR region of an MR head utilizing a conventional MRS structure to be followed by a self-aligned PM film sputtering step. The structure corresponding to that previously described with respect to FIG. 4 is like numbered and the foregoing description thereof shall suffice herefor.

While there have been described above the principles of the present invention in conjunction with specific thin film devices, such as MR sensors utilizing aligned PM layers to provide longitudinal bias thereto, the foregoing description is made only by way of example and not as a limitation to the scope of the invention. In this regard, the method of the present invention is applicable to any thin film processing application utilizing photoresist wherein a re-entrant (or undercut) profile is desirably provided to facilitate subsequent removal of the photoresist by means of a suitable solvent.

What is claimed is:

1. A process for facilitating lift-off of photoresist patterned on a substrate in conjunction with photolithographic processing of said substrate to define a surface feature, said process comprising the steps of:

patterning said photoresist on a major surface of said substrate to define a patterned area;

cross-linking a first portion of said photoresist distal to said substrate;

solubilizing a second portion of said photoresist proximal to said substrate; and developing said photoresist to create an undercut in said photoresist peripherally surrounding said patterned area.

2. The process of claim 1 further comprising the step of:

etching said photoresist and said major surface of said substrate to define said surface feature.

3. The process of claim 2 further comprising the step of:

stripping away said photoresist.

4. The process of claim 1 wherein said step of patterning is carried out by the steps of:

coating said substrate with said photoresist to form a photoresist layer;

projecting a mask pattern onto said photoresist layer corresponding to said patterned area;

exposing said photoresist layer to an energy source through said mask pattern; and dissolving portions of said photoresist layer surrounding said patterned area.

5. The process of claim 1 wherein said step of cross-linking is carried out by the steps of:

disposing said substrate and patterned area in an atmosphere of substantially 25 mTorr or less; and exposing said first portion of said photoresist of said patterned area to an electron source of substantially 300 $\mu C/cm^2$ at a voltage of substantially 10 kV.

6. The process of claim 5 wherein said step of solubilizing is carried out by the step of:

further exposing said first and second portions of said photoresist of said patterned area to an electron source of substantially 50 $\mu C/cm^2$ at a voltage of substantially 10 kV in an atmosphere of substantially 0.25 mTorr.

7. A thin film device produced by a process comprising the steps of:

furnishing a substrate;

coating a major surface of said substrate with photoresist to form a photoresist layer;

projecting a mask pattern on said photoresist layer corresponding to a patterned area;

exposing said photoresist layer to an energy source through said mask pattern;

dissolving portions of said photoresist layer surrounding said patterned area to define a surface feature on said substrate;

cross-linking a first portion of said photoresist of said patterned area distal to said substrate;

solubilizing a second portion of said photoresist of said patterned area proximal to said substrate;

developing said photoresist to create an undercut in said photoresist peripherally surrounding said patterned area; and etching said photoresist of said patterned area and said major surface of said substrate to define said surface feature.

8. The thin film device of claim 7 produced by a process further comprising the step of:

depositing a thin film layer overlying said photoresist of said patterned area and said major surface of said substrate.

9. The thin film device of claim 8 produced by a process further comprising the step of:

stripping away said photoresist and said thin film layer overlying said patterned area.

10. The thin film device of claim 9 wherein said major surface of said substrate further comprises an overlying MRS structure and said surface feature comprises an MR region.

11. The thin film device of claim 10 wherein said thin film layer comprises a PM layer.

12. A process for forming a thin film device utilizing at least one photoresist region having a re-entrant profile, said process comprising the steps of:

patterning a photoresist region on a substrate having a major surface thereof;

differentially processing said photoresist region to create a first portion thereof relatively insoluble to a developer and a second portion thereof relatively soluble to said developer; and developing said photoresist in said developer for a time to create said re-entrant profile in said second portion of said photoresist.

13. The process of claim 12 wherein said step of processing is carried out by the steps of:

cross-linking said first portion of said photoresist region to render said first portion of said photoresist relatively insoluble in a developer;

solubilizing said second portion of said photoresist region to render said second portion of said photoresist relatively soluble to said developer.

14. The process of claim 13 wherein said step of cross-linking is carried out by the steps of:

disposing said substrate and said photoresist region in an atmosphere of substantially 25 mTorr or less; and exposing said first portion of said photoresist of said patterned area to an electron source of substantially 300 $\mu C/cm^2$ at a voltage of substantially 10 kV.

15. The process of claim 12 wherein said step of patterning is carried out by the steps of:

coating said substrate with said photoresist to form a photoresist layer;

projecting a mask pattern onto said photoresist layer corresponding to said patterned area;

exposing said photoresist layer to an energy source through said mask pattern; and dissolving portions of said photoresist layer surrounding said patterned area.

16. The process of claim 12 wherein said step of differentially processing said photoresist region is carried out by the steps of:

accelerating a first electron beam dose into said first portion of said photoresist region; and exposing said first and second portions of said photoresist region to a second electron beam dose.

* * * * *